(12) United States Patent
Sundin et al.

(10) Patent No.: US 6,415,803 B1
(45) Date of Patent: Jul. 9, 2002

(54) METHOD AND APPARATUS FOR SEMICONDUCTOR WAFER CLEANING WITH REUSE OF CHEMICALS

(75) Inventors: James B. Sundin, Chandler; Richard S. Tirendi, Phoenix; Paul W. Dryer, Gilbert, all of AZ (US)

(73) Assignee: Z Cap, L.L.C., Scottsdale, AZ (US)

( * ) Notice: Subject to any disclaimer, the term of this patent is extended or adjusted under 35 U.S.C. 154(b) by 0 days.

(21) Appl. No.: 09/434,079

(22) Filed: Nov. 5, 1999

Related U.S. Application Data
(60) Provisional application No. 60/157,980, filed on Oct. 6, 1999.

(51) Int. Cl.$^7$ ................................................ B08B 3/02
(52) U.S. Cl. ...................... 134/113; 134/902; 134/111; 134/186; 134/108
(58) Field of Search ................................. 134/184, 186, 134/155, 902, 111, 110, 105, 108, 113

(56) References Cited

U.S. PATENT DOCUMENTS

| | | | |
|---|---|---|---|
| 3,881,872 A | 5/1975 | Naono ........................ 23/253 |
| 4,156,621 A | * 5/1979 | Andrews et al. |
| 4,855,023 A | * 8/1989 | Clark et al. |
| 4,917,123 A | 4/1990 | McConnell et al. .......... 134/95 |
| 5,148,823 A | * 9/1992 | Bran |
| 5,201,958 A | * 4/1993 | Breunsbach et al. |
| 5,431,178 A | * 7/1995 | Chiu |
| 5,437,710 A | * 8/1995 | Grant et al. |
| 5,554,064 A | 9/1996 | Breivogel et al. |
| 5,647,386 A | 7/1997 | Kaiser ........................ 134/113 |
| 5,656,097 A | 8/1997 | Olesen et al. .................. 134/1 |
| 5,722,441 A | * 3/1998 | Teramoto |
| 5,882,598 A | 3/1999 | Lindquist ................ 422/82.02 |
| 5,884,640 A | 3/1999 | Fishkin et al. |
| 5,908,509 A | 6/1999 | Olesen et al. ............... 134/1.3 |
| 6,146,468 A | 11/2000 | Dryer et al. .................. 134/10 |
| 6,164,133 A | * 12/2000 | Watanabe |
| 6,178,975 B1 | * 1/2001 | Aoki |

FOREIGN PATENT DOCUMENTS

| | | | |
|---|---|---|---|
| JP | 61-281532 | * 12/1986 | ................. 134/902 |
| JP | 63-314835 | * 12/1988 | ................. 134/902 |
| JP | 1-346835 | * 10/1989 | ................. 134/902 |
| JP | 2-135734 | * 5/1990 | ................. 134/902 |
| JP | 3-232227 | * 10/1991 | ................. 134/902 |
| JP | 4-177726 | * 6/1992 | ................. 134/902 |
| JP | 4-256318 | * 9/1992 | ................. 134/902 |
| JP | 4-278529 | * 10/1992 | ................. 134/902 |

* cited by examiner

Primary Examiner—Frankie L. Stinson
(74) Attorney, Agent, or Firm—Jeffrey D. Moy; Harry M. Weiss; Weiss & Moy, P.C.

(57) ABSTRACT

An apparatus and method for cleaning and rinsing of disk-shaped objects, such as silicon wafers, high precision lenses and the like. The cleaning and rinsing may take place in a single chamber, that is sequentially filled with cleaning solution, rinsing solution, and the like. In an important aspect of the invention, chemical cleaning solutions are dumped to containers and recycled for the use. Moreover, a cleaning solution composition may be monitored, and the concentration of solution can be adjusted automatically, or make-up chemicals may be added, as necessary. The apparatus has a relatively small footprint and maybe surrounded with an enclosure that may be kept at lower than atmosphere pressure to prevent escape of potentially hazardous contaminants into the environment. In preferred embodiments of the invention, the handling of wafers to be cleaned is carried out robotically, most preferably using a robot with at least two end-effectors, each adapted for a specific function. The apparatus of the invention provides the advantage of permitting the recycling of cleaning solutions, thereby reducing the amount of hazardous waste generated for disposal, while at the same time reducing the cost of cleaning and rinsing wafers.

11 Claims, 13 Drawing Sheets

(θ) COPPER

METHOD AND APPARATUS FOR SEMICONDUCTOR WAFER CLEANING WITH REUSE OF CHEMICALS

This application claims the benefit of Provisional application 60/157,980 filed Oct. 6, 1999.

BACKGROUND OF THE INVENTION

1. Field of Invention

The invention relates to the fabrication of semiconductor wafers, and more especially to wafer cleaning processes that take place during fabrication. These processes generally entail contacting the wafers with chemicals that may be corrosive and hazardous, and then rinsing and drying the cleaned wafer surfaces either to produce a final product, or to enable further fabrication steps.

2. Description of the Related Art

In the fabrication of semiconductor devices, a disc-shaped silicon wafer is subjected to a variety of technologies to create layered structures of semiconductors on its surface. At various stages during this fabrication, the wafer must be subjected to polishing for planarization and to remove surface defects, and post-polishing cleaning before additional structures can be formed on each semiconductor of the wafer. Absent such cleaning, residual contaminants on the wafer surface would preclude the manufacture of modern, highly miniaturized, integrated circuit semiconductor structures.

Polishing for planarizing structure on the wafer surface and removing surface defects often utilizes a chemical slurry in conjunction with a polishing pad for polishing the wafer surface. Such slurry-assisted polishing is referred to as "chemical mechanical polishing" or "CMP". Where the polishing is carried out using CMP, or another technique, a polished surface will be contaminated with fine particulates (from the slurry or produced by polishing) and other minute contaminants that must be removed to prevent potential for interference with electrical circuitry being formed on the wafer. Accordingly, after polishing the semiconductor wafers undergo a surface cleaning process, utilizing aggressive chemicals to remove contaminants, followed by rinsing to remove any chemicals and residue, and finally a drying stage to remove rinse fluids. After drying, the cleaned wafers may be subjected to additional fabrication steps.

At the present time, the cleaning and rinsing stages of semiconductor fabrication results in the generation of large volumes of chemical solutions and contaminated water that must be treated for disposal. The chemicals, in particular, do not only pose an environmental hazard, as determined by the United States Environmental Protection Agency (EPA), but also represents a significant additional operating cost in the fabrication of semiconductor wafers. There exists a need to reduce the amount of waste generated for disposal, both for environmental and cost reasons. Notwithstanding, current technology fails to address this need. Moreover, current technology requires separate containers for cleaning and for rinsing the wafers thereby necessitating wafer transfer from one apparatus to another. Such handling poses risk of wafer damage and also increases the overall time for the cleaning/rinsing operation. Accordingly, a process that reduces wafer handling and the time for cleaning and rinsing would present significant advantages. Additionally, if such processes could be carried out on a single station, with a relatively small "footprint" that requires less space than current apparatus, then it would present further advantages in the more efficient use of expensive space in the fabrication environment. Desirably, the single station should also be self contained in the sense of not emitting particles to its surroundings that could contaminate its environment and other fabrication processes.

SUMMARY OF THE INVENTION

The invention provides a unique apparatus for the cleaning and rinsing of disc-shaped substrates, such as silicon wafers, high precision lenses, and the like. This Summary of the Invention section is intended to introduce the reader to aspects of the invention and is not a complete description of the invention. Particular aspects of the invention are pointed out in other sections here below and the invention is set forth in the appended claims, which alone demarcate its scope.

In one aspect of the invention, there is provided a method of cleaning and rinsing the disc-shaped substrates in a single chamber, albeit that the invention is not limited to using a single chamber. The method includes cleaning surfaces of a plurality of disc-shaped substrates in the chamber with a cleaning solution, and rapidly removing the chemical cleaning solution from the chamber. During the process, the disc-shaped substrates are also rinsed with a rinsing liquid, that is likewise rapidly removed from the chamber, preferably under gravity.

In another aspect of the invention, there is presented a method for cleaning disc-shaped substrates and reusing cleaning solutions to minimize the generation of chemical wastes. This method includes immersing a plurality of disc-shaped substrates in a chemical cleaning solution, for a sufficient time to provide cleaning action. The cleaning solution is then dumped to a holding tank. Solution from the holding tank is filtered and analyzed for chemical properties. Depending upon the analysis, a portion of the chemical solution may be routed to disposal, and fresh chemical solutions may be added until the analysis of the chemical solution is within a required range of specification. The chemical solution may then be recycled for reuse in cleaning other substrates.

In another aspect of the invention, there is a method of cleaning, rinsing and drying batches of disc-shaped substrates in a single chamber. The method may use recycled chemical cleaning solution or may use fresh chemical cleaning solution. In accordance with the method, a plurality of disc-shaped substrates is cleaned in the chemical solution in a cleaning chamber. After cleaning the substrates, the chemical cleaning solution is dumped from the chamber, filtered and analyzed. The method includes rinsing the substrates in the chamber with a rinse liquid, and dumping the rinse liquid from the chamber after rinsing. The rinsed substrates are dried in the cleaning chamber, and the dried substrates are then removed from the chamber and replaced with a second plurality of substrates. Preferably, this second plurality of substrates is cleaned with recycled chemical cleaning solution that comprises at least a portion of the dumped, filtered and analyzed solution used to clean the first plurality of substrates.

In another aspect, a method of the invention cleans a plurality of disc-shaped substrates using megasonic wave energy. In accordance with this method, a plurality of substrates are immersed in a cleaning solution while megasonic wave energy is applied. After the substrates have been subjected to the cleaning solution and megasonic wave energy for a sufficient amount of time to produce substantial cleaning, the cleaning solution is dumped from the chamber.

The invention also provides an apparatus for cleaning disc-shaped substrates and reusing a chemical cleaning solution. The apparatus includes a chamber sized for receiving a plurality of substrates to be cleaned, the chamber having an outlet in its base for draining liquids therefrom. A plenum is located beneath the base of the chamber for receiving liquids drained from the chamber. The plenum has at least two outlets in its base. Each of the outlets in fluid communication with a holding tank. Further, the apparatus includes a recycle system for at least the chemical solution in one of the holding tanks. The recycle system includes an analyzer for chemical analysis of liquid in the holding tank, and a particle detector for detection of particulates in the liquids in the holding tank. The recycle system also includes a pump capable of recycling liquid from the holding tank to the cleaning chamber for cleaning the substrates.

In accordance with the invention, there is also presented a unique cleaning chamber that includes several features. Among these features are that the container is sized to contain a plurality of spaced apart disc-shaped substrates arranged in a horizontal stack for cleaning, and the container is sufficiently deep so that the substrates may be immersed in liquids within the container, when the container is in use. The container has an inner surface that is resistant to corrosive chemicals used in cleaning the substrates at temperatures in the range from about 60° to 95° C. Advantageously, the chamber may be equipped with a weir located adjacent its upper surrounding room, for receiving liquid spill over from the container, when the container is in use. Further, in one aspect of the container, the container has a V-shaped base (viewed from one end) converging to a central outlet duct that preferably extends along a substantial portion of the container. Inner surfaces of the container are preferably smooth and free of traps for retention of particulate contaminants and liquids, to allow rapid drainage and cleaning of the interior of the chamber.

In another aspect of the invention, there is presented an apparatus for holding a plurality of disc-shaped substrates in a horizontal stack, in spaced apert face-to-face relationship. The apparatus includes at least a base and a pair of upper parallel rods, of substantially equal length, with opposite ends mounted to a common end plate. Each of the upper pair of rods have, on inboard sides, equidistantly spaced notches of sufficient width for insertion of an edge portion of a disc bearing, each notch of one of the pair of rods is in registration with a notch on the other of the pair of rods. As a result, discs placed in registered notches of the rods will be aligned substantially vertically. To assist in robotic handling of the disc holder, the holder may be equipped with a vertical handle, ideally located proximate the mid-point of the rods, with an upper end that is adapted for being grasped by an end effector of a robot.

The invention provides many advantages over the prior art, as will be more fully appreciated from a study of the Detailed Description Section, here below. Among the notable advantages are the capability to reuse chemicals and so reduce hazardous waste generation and disposal, while also reducing chemical costs. Moreover, if desired, in certain embodiments the entire apparatus can be contained within a single station with a relatively small footprint. In that event, the steps of cleaning, rinsing and drying may be carried out in a single cleaning chamber. Further, a robot may be employed to load and unload the cleaning station with substrates.

BRIEF DESCRIPTION OF THE DRAWINGS

The following drawings are illustrative of embodiments of the invention and therefore do not limit the scope of the invention, but may assist in a proper understanding of the invention. The drawings are not to scale and are intended for use in conjunction with the explanations in the following Detailed Description Section.

DETAILED DESCRIPTION OF THE PREFERRED EMBODIMENTS

This section illustrates aspects of the invention, and points out certain preferred embodiments of these aspects. This section is not intended to be exhaustive, but rather to inform and teach the person of skill in the art who will come to appreciate more fully other aspects, equivalents, and possibilities presented by invention, and hence the scope of the invention as set forth in the claims, which alone limit its scope.

Overview of Method of Invention

Figure 1A:
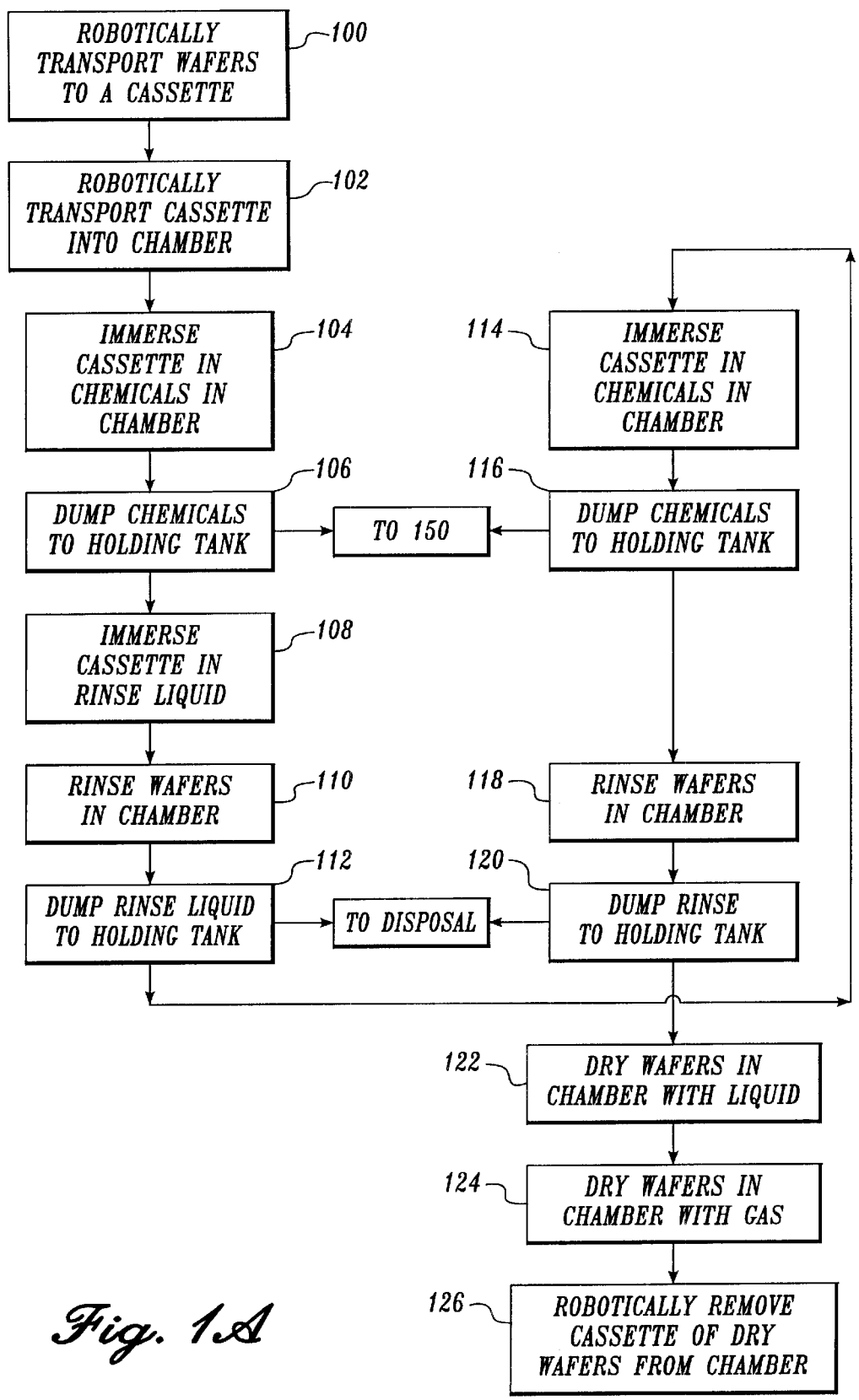
FIG. 1A is a schematic flow diagram illustrating steps in the cleaning of semiconductor wafers, in accordance with a preferred embodiment of the invention.

The invention may be better understood with reference to FIG. 1A that schematically illustrates an overview of the steps of an embodiment of the method of the invention. In this particular embodiment, a work robot transports wafers to a cassette adapted for holding the wafers so that they are spaced apart with surfaces exposed for cleaning, step 100. Next, in step 102, preferably the same robot using a different end effector transports the wafer-filled cassette into a cleaning chamber in an apparatus of the invention, described in more detail below. In step 104, the cassette containing the wafer is immersed in a chemical cleaning solution in the cleaning chamber. During the immersion, the cleaning solution contacts all surfaces of the wafers to be cleaned and removes contaminants from the surfaces. Next, in step 106, the chemical solution is rapidly dumped from the chamber, preferably under gravity into a plenum and thence through a valved opening in the base of the plenum, into a conduit leading to a chemicals holding tank. The chamber is now refilled with a rinse liquid in which the wafers are immersed, in step 108. After rinsing the wafers in the chamber, in step 110, the rinse liquid is dumped to holding tank in step 112. Thereafter, the chamber is once again filled with a chemical cleaning solution, either the same or different from the first cleaning solution, to continue the process of cleaning the wafer surfaces. Next, the chemicals are dumped from the chamber to a holding tank in step 116. The chamber is then refilled with rinse liquid and the wafers are rinsed of chemicals in step 118. The rinse water is dumped from the chamber to a holding tank, in step 120. After a sufficient number of rinses, the wafers are dried in the chamber in this embodiment of the invention in a two step process commencing with contacting the wafers with a composition that modifies the surface tension of water thereby allowing water to drain more readily from the wafer surfaces, in step 122. This is followed by a second drying, step 124, in which the wafers are exposed to a heated gas of low humidity to remove residue water and solvents, in step 124. Finally, a robot removes the cassette of clean dry wafers from the chamber in Step 126.

With regard to the fluids used in the cleaning and the rinsing processes, FIG. 1A indicates that dumped chemicals are routed to a holding tank. These chemicals are then analyzed and if within specification, reused in the cleaning process. If the solution is not within specification, it may be adjusted to specification and reused. The monitoring and control of cleaning solution chemistry is schematically set forth in FIG. 1B. While rinse solution may also be recovered, for example through filtration, deionization and reverse osmosis treatment, the embodiment of FIG. 1A indicates routing of this liquid from the holding tanks to disposal.

Figure 1B:
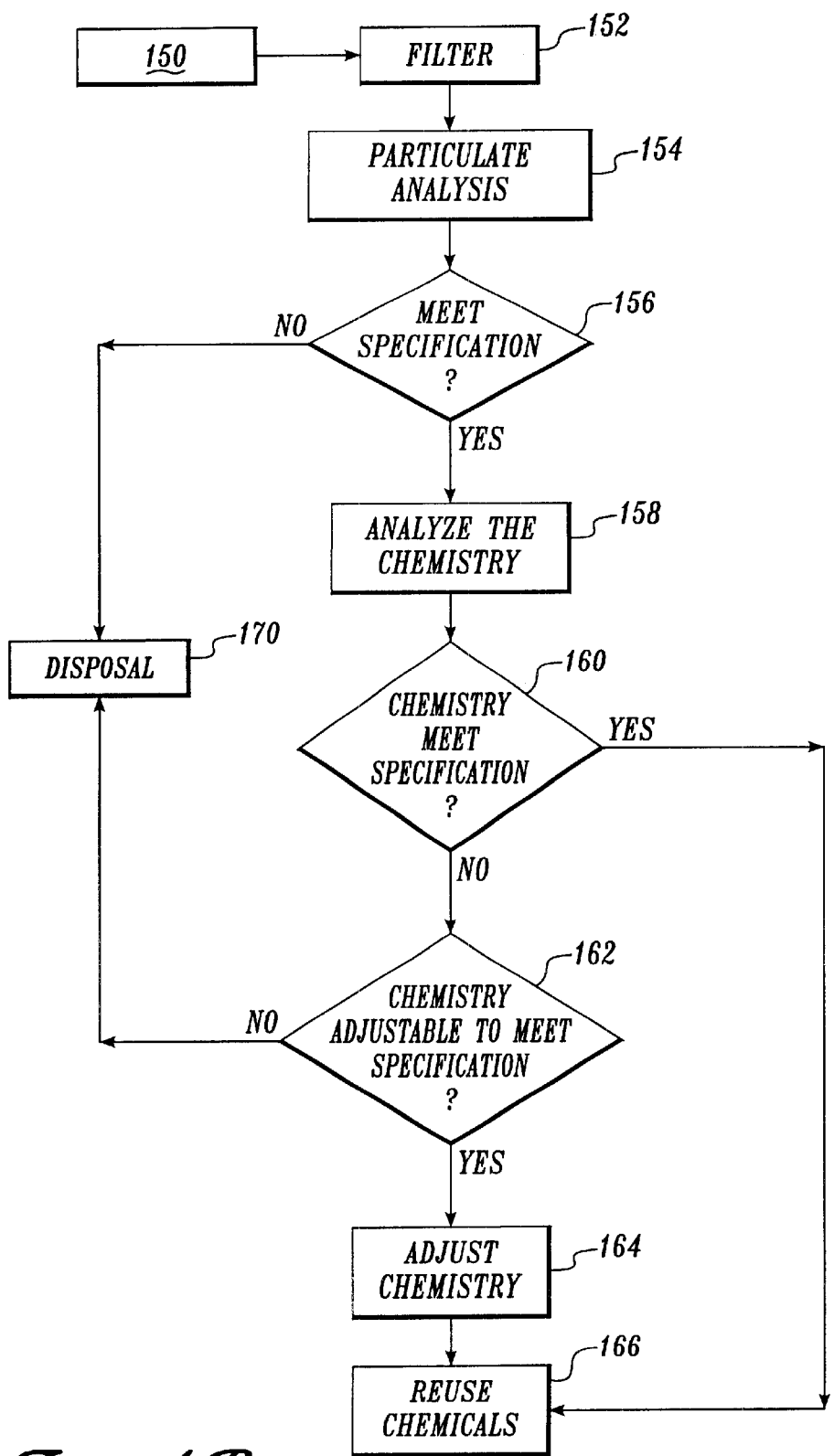
FIG. 1B is a flow diagram illustrating logic of an embodiment of a recycle system for reuse of chemical cleaning solutions, in accordance with an embodiment of the invention.

Referring to FIG. 1B, each chemical solution has a separate monitoring and control system. Thus, each chemical solution is pumped through a filter 152 and then undergoes particulate analysis to determine the number and size of particles present in a volume of the solution. Based on the analysis, it is determined in step 156 whether the solution meets particulate specifications. If specifications are not met, the solution is routed to disposal, step 170, otherwise the chemistry of the solution is then analyzed step 158. The results of the chemical analysis are compared with a predetermined specification step 160. If the chemical solution meets specified criteria, the chemical is routed back to the holding tank for reuse in step 166. Otherwise, a determination is made to either adjust the chemistry to meet specification or dispose of the chemical solution in step 162. If the chemical solution is determined to be adjustable, the pertinent chemicals are adjusted in step 164, so that the solution can be reused.

Overview of Apparatus of the Invention

Figure 2:
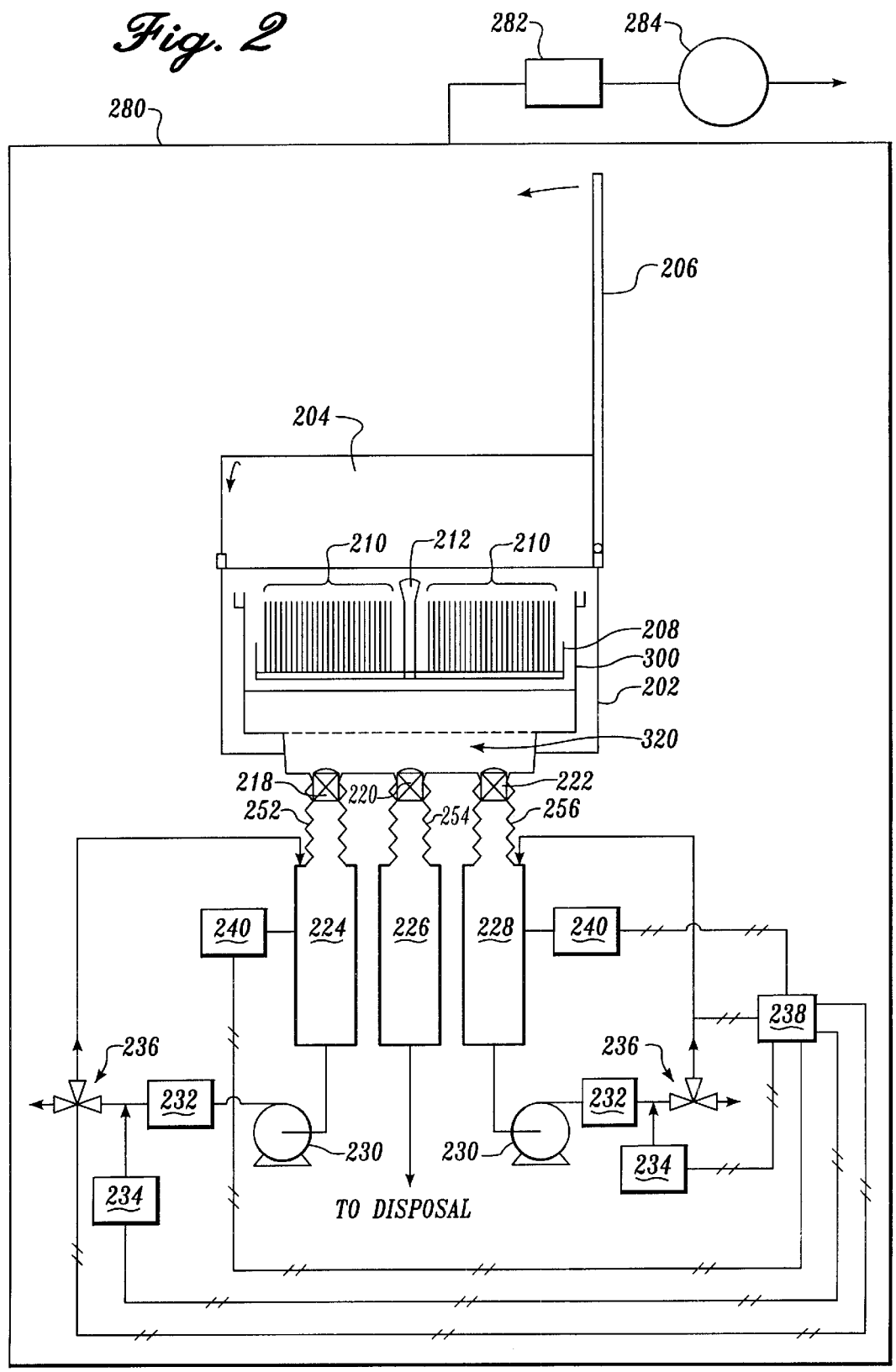
FIG. 2 is a schematic diagram illustrating an embodiment of the apparatus of the invention.

An overview of the apparatus of the invention may be obtained by reviewing the schematic of a particular embodiment of the invention shown in FIG. 2. A cleaning chamber 300 is located within a container 202 that is fitted with a pair of lids, 204 and 206, the use of which is become apparent from the description below. As shown, a cassette 208, described more fully below, filled with a plurality of wafers 210 resides in the chamber 300. The cassette includes a central handle 212 adapted for being grasped by an end effector of a robot for ease of automated transport of the wafer-filled cassette 208 into and out of the chamber 300. Plenum 320 is located below chamber 300 and is in fluid communication with the chamber to receive liquid from the chamber and drain the liquid from the chamber when fast acting valves 218,220, 222 at the base of the plenum are opened.

In the illustrated embodiment, plenum 320 is fitted with three drain points, each equipped with a valve 218, 220, 222. These fast acting valves, described in more detail below, control the rapid flow of liquid from chamber 300 to plenum 250 and thence to one of holding tanks 224, 226 and 228 respectively.

Chemical cleaning solution holding tank 224 receives dumped cleaning solution from the plenum 250 via valve 218 and through bellows 252. The tank is in fluid communication with the inlet port of a pump 230 that pumps the solution through a filter 232, after which a particulate analyzer 234, preferably online, monitors the particulate content of the solution in real time. A control system such as a downstream 3-way valve 236, controlled by a controller 238, is used to control routing of the cleaning solution back to the holding tank 224, or to disposal. A chemical analyzer 240 analyzes critical chemical concentrations and physical properties of the cleaning solution, and relays the information to controller 238. Based on input from analyzer 240, controller 238 operates to control routing of the solution, for instance it may control valve 236 to route cleaning solution to disposal, or recycle the solution to holding tank 224. Chemical holding tank 228 is equipped with a similar scheme for control and monitoring of its chemical solution, identified with the same numerals, for simplicity, although these may be different when the solutions are dissimilar and different parameters are measured and controlled.

One of the holding tanks, tank 226 is used to contain rinse liquid, typically deionized water that may contain additives, as discussed below. The rinse liquid may also be monitored and controlled, like the cleaning liquids, or could be routed to disposal.

Preferably, the entire apparatus is enclosed in a surrounding housing 280 which is maintained at a negative pressure relative to surroundings so that air only flows into the housing. This reduces the risk of particulate or contaminant escape into the surroundings with possible contamination of the surroundings. To maintain negative pressure, air is drawn out of the housing 280 by an induction fan 284, through HEPA filter 282 that removes particles from exhausted air.

The Cleaning Chamber, Plenum and Fast-Fast-Acting Valves

Figure 3A:
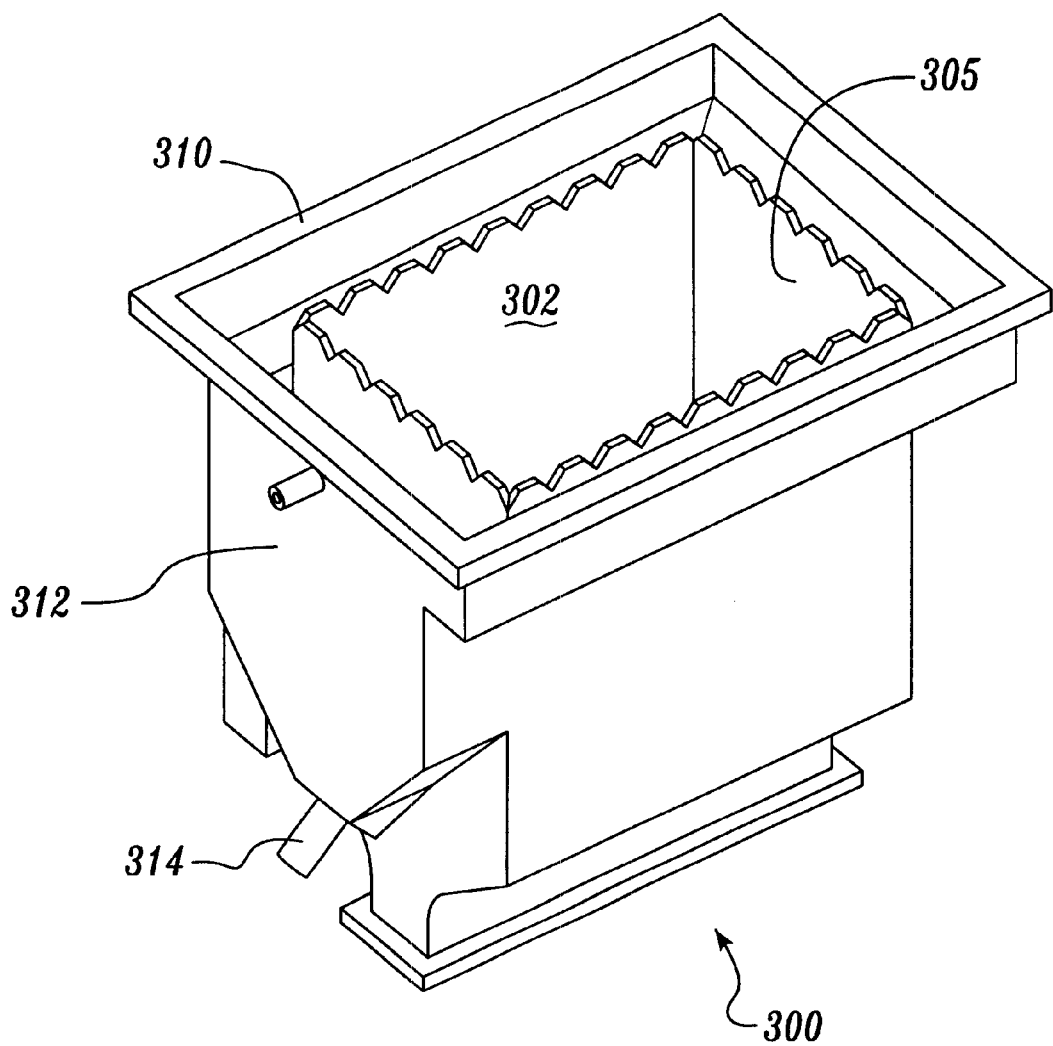
FIG. 3A is a perspective view of a cleaning chamber in accordance with an embodiment of the invention.
Figure 3B:
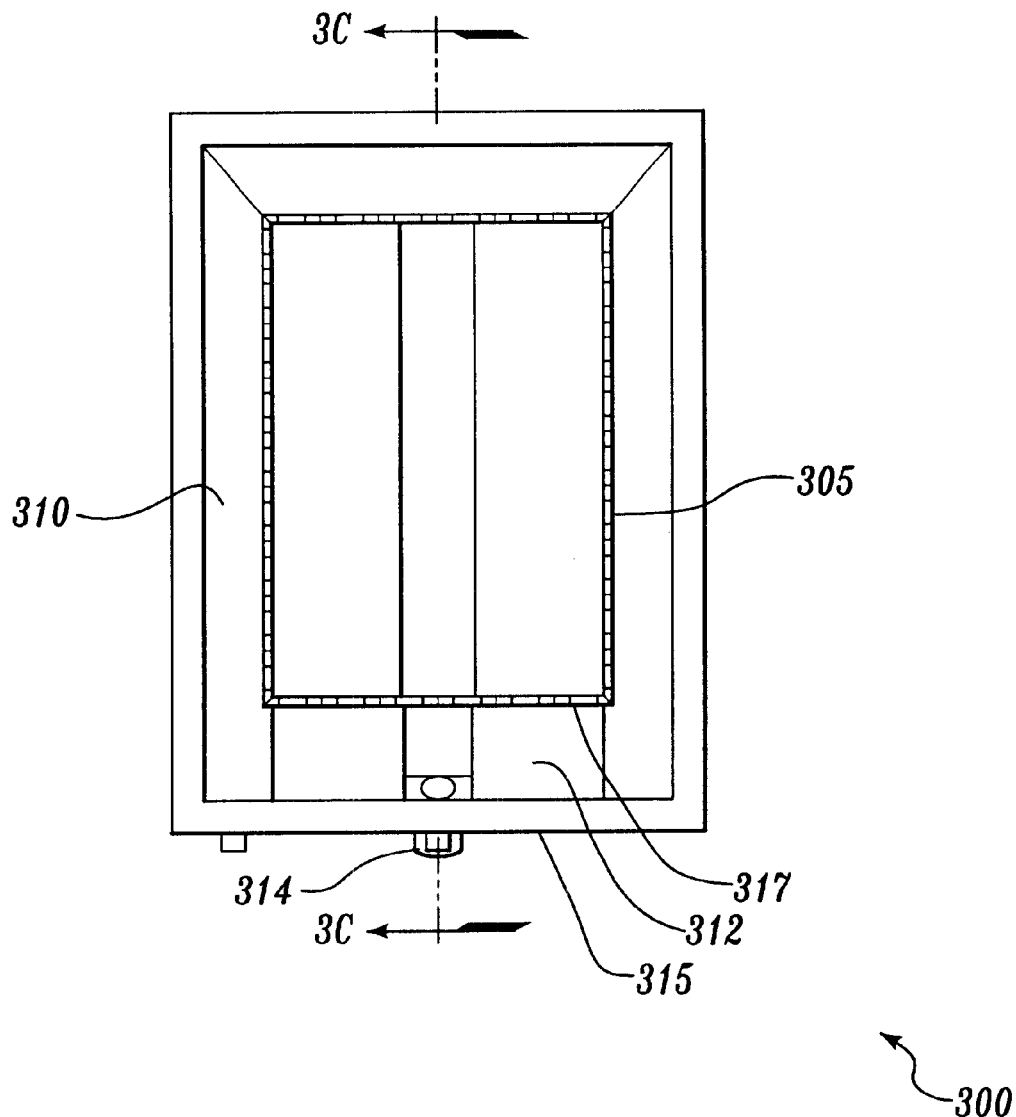
FIG. 3B is a top view of the cleaning chamber of FIG. 3A.
Figure 3C:
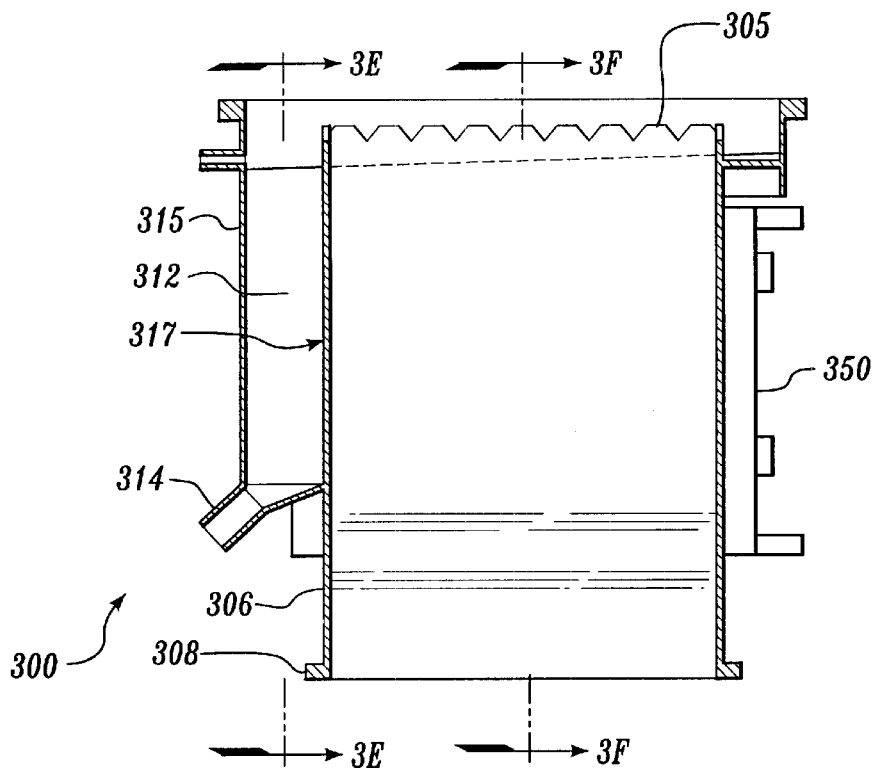
FIG. 3C is a cross-sectional view of the cleaning chamber of FIGS. 3A and 3B, taken at 3C—3C on FIG. 3B.
Figure 3D:
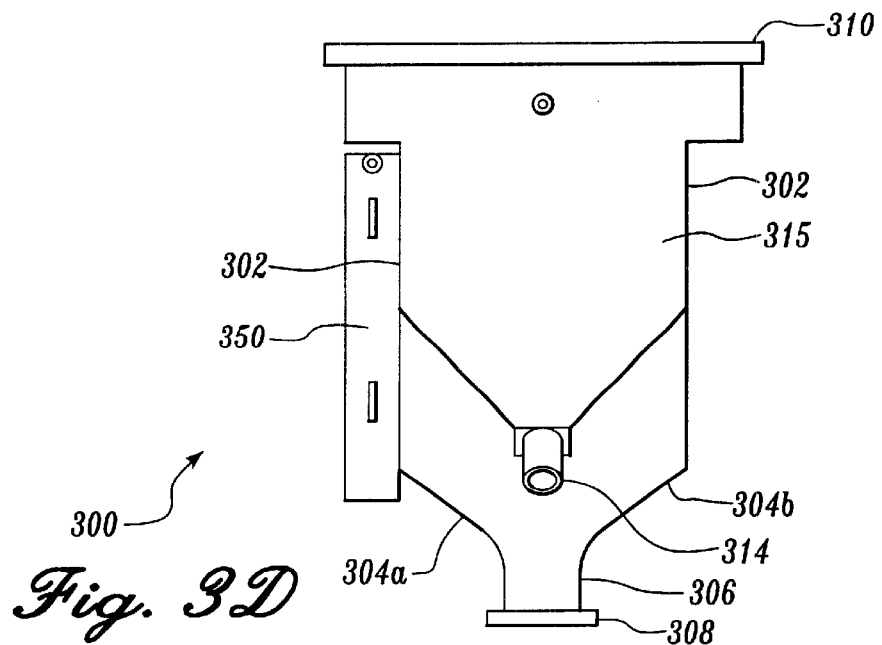
FIG. 3D is an end view of the cleaning chamber of FIG. 3A.
Figure 3E:
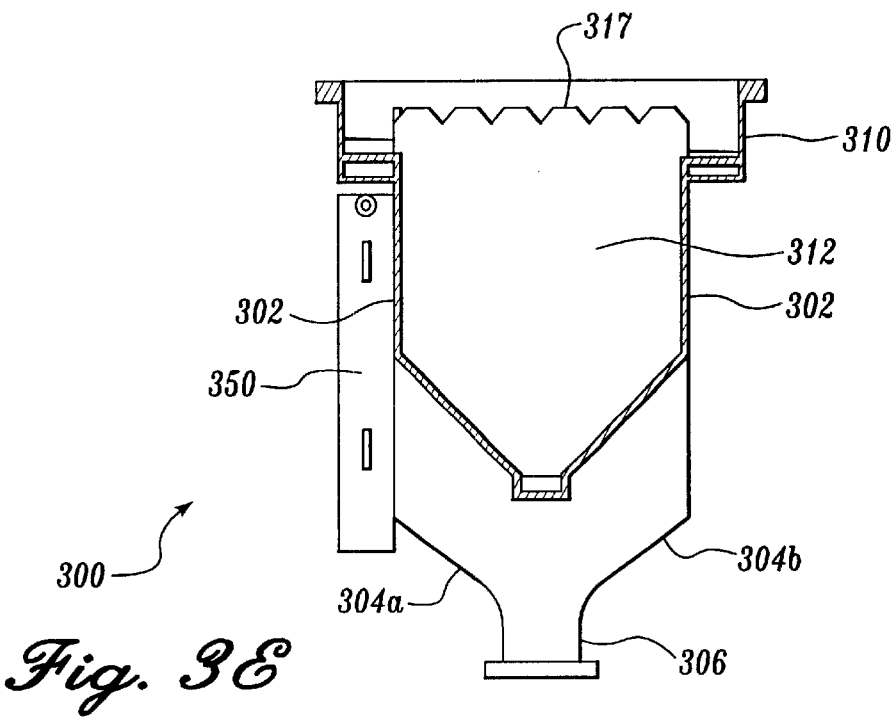
FIG. 3E is an end view section taken at 3E—3E of FIG. 3C, of a cleaning chamber in accordance with the invention.
Figure 3F:
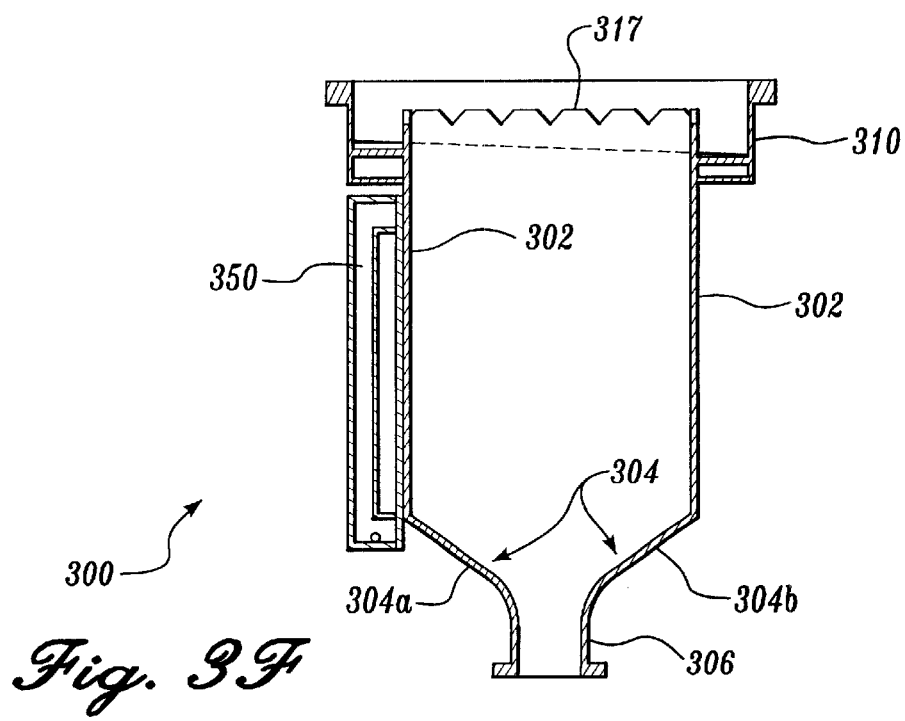
FIG. 3F is a end sectional view taken at 3F—3F of FIG. 3C of this embodiment of the cleaning chamber of the invention.

As shown in FIGS. 3A–3F, the apparatus of the invention includes a cleaning chamber 300 especially adapted for cleaning a plurality of disk-shaped substrates contained in an axially spaced apart arrangement within the chamber. In one embodiment, the chamber 300 is substantially rectangular, viewed from above, see FIG. 3B. From the side, shown in FIG. 3C, the chamber also appears substantially rectangular, and a front-end view FIG. 3D shows opposed substantially vertical side walls 302 with base walls 304a and 304b extending inward from each of the side walls 302 to form a v-shaped downwardly sloping base 304 to enhance the flow of liquid through central outlet duct 306 from the chamber, when valves 218, 220 and 222 are opened as explained below. The downwardly sloping base walls 304a, 304b terminate in a substantially vertical outlet conduit 306 of the chamber 300 that extends substantially along the entire length of the chamber 300. The lower end 308 of the outlet of the chamber 306 is in fluid communication with a plenum 320 as shown, for instance, in FIG. 5A that provides a liquid hold-up space beneath the cleaning chamber 300. The base 322 of plenum 320 is a sufficient distance d from the interior of chamber 300 to substantially eliminate or prevent backflow of liquid or particulates into the cleaning chamber, from the base region of the plenum. While the particular shape of the plenum is not critical, a preferred plenum is sized to facilitate rapid drainage of liquid from the chamber 300 when fast-acting dump valves 218, 220 or 222 are opened. The plenum preferably extends substantially along the entire length of the outlet conduit 306, which in turn extends substantially along the entire length of the cleaning chamber.

Figure 5A:
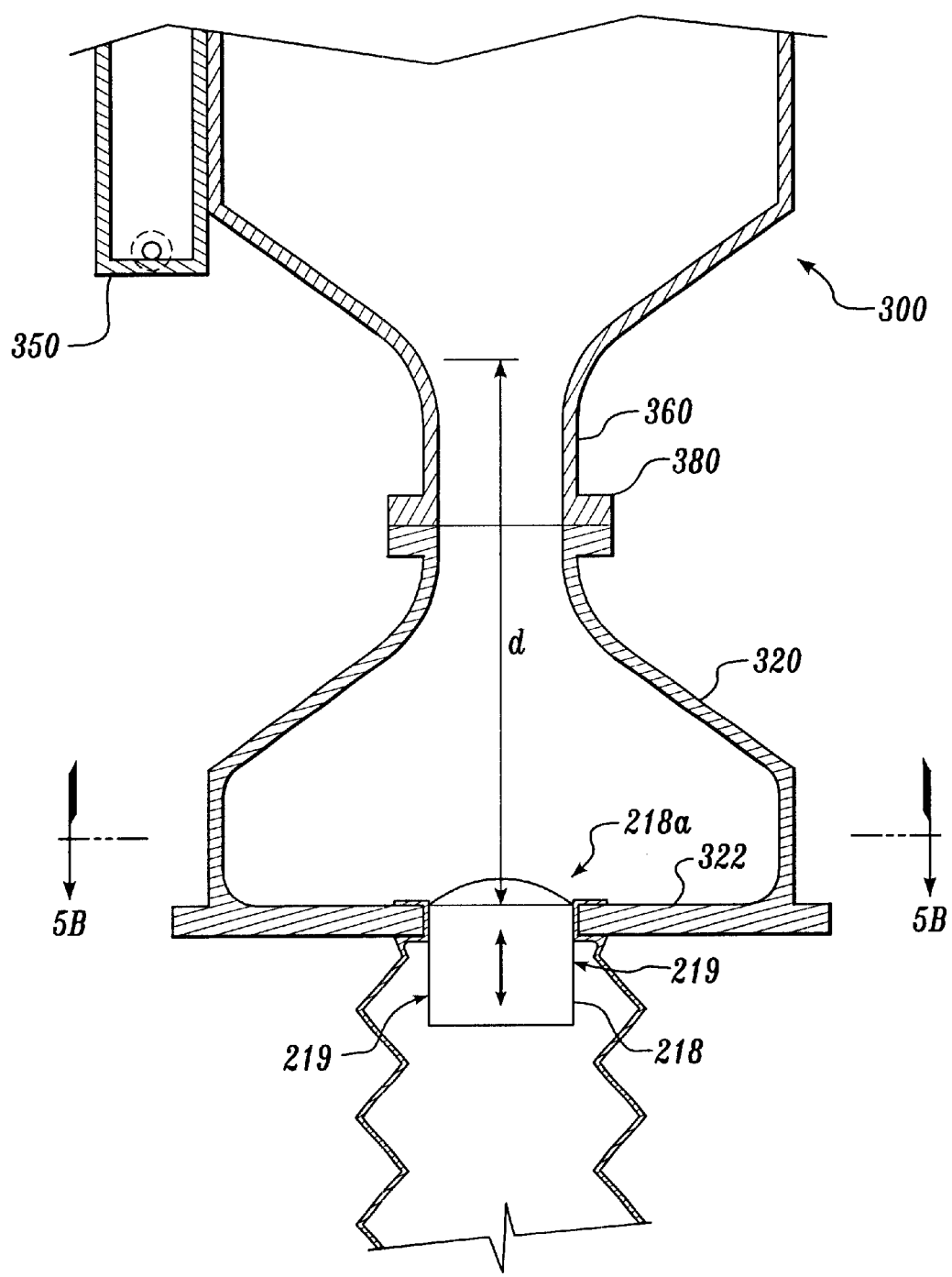
FIG. 5A is a cross-sectional view of an embodiment of the cleaning chamber mounted to the plenum, in partial cross sectional view, also showing a fast acting valve seated in the base of the plenum, in cross-sectional view taken at 5A—5A of FIG. 5A.
Figure 5B:
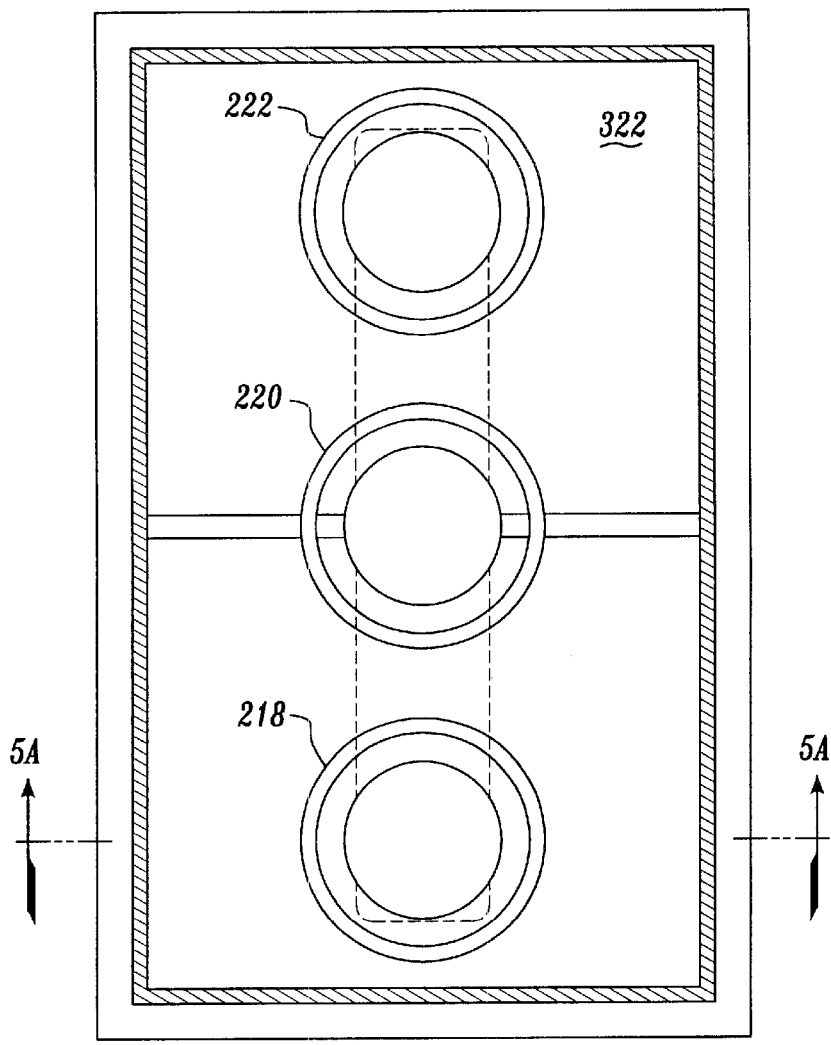
FIG. 5B is a plan view of a base of a plenum, used in conjunction with the cleaning apparatus in accordance with an embodiment of the invention.

A plurality of fast-acting valves, three valves in the embodiment illustrated in FIGS. 2 and 5B, are mounted in bellows that are in fluid communication with the plenum through the valves. Each of these valves conveys liquid through the bellows as a conduit from the cleaning chamber 300 and plenum to a holding tank. Thus, the chemicals used in different treatment cycles in the cleaning chamber can be separated and reused, as explained above and below herein.

In the embodiment shown, which is a preferred embodiment, the valves 218, 220, 222 are fast acting valves that are mounted flush with the base 322 of the plenum 320 to substantially eliminate or reduce entrapment spaces for particulates as shown in FIGS. 5A and 5B. Thus, for instance, in the embodiment shown in FIG. 5A, the upper surface 218a of the valve 218 has a substantially domed shape, with the apex of the dome extending inside the plenum, above the base 322 of the plenum 320. The cylindrical sides 219 of the valve 218 extend at least up to the inner surface 322 of the base of the plenum, so that particulate entrapment spaces are eliminated. The dome shape of the valve further reduces the possibility of reintroducing particulates into the plenum, after dumping liquids through and over the valve surface via the bellows 252 into the holding tank 224 below, providing a surface from which the particulates will flow downward. To further reduce the possibility of particulate retention on the valve surface that extends into the plenum 320, the surface 218a may be coated with TEFLON®, or another hydrophobic substance.

Returning to the cleaning chamber 300 and FIGS. 3A–3F, the chamber includes a weir 310 at least partially surrounding the upper rim 305, for receiving overflow liquids from the chamber. The weir 310 drains to a reservoir 312 at an end of the chamber 300, formed by an outer wall 315 and the chamber end wall 317. The reservoir 312 has at least one outlet 314 that is in fluid communication through conduits and appropriate valving to the holding tanks 224, 226, 228. Depending upon the liquid in the cleaning chamber, a valve, such as the illustrated example of a three-way valve 318, can be automatically set to route overflow from reservoir 312 to the appropriate holding tank, to avoid mixing of different chemicals.

Preferably, as explained above, the cleaning chamber 300 should be substantially free of any entrapment points for particulates or liquids. The interior surface of the cleaning chamber should be smooth and continuous, and should preferably be of a type that will shed aqueous liquids, i.e., that is hydrophobic and that will not attract or retain particulate contaminants on its surface. Moreover, since the method of the invention requires the rapid dumping of liquid from the chamber 300, the material of the chamber is preferably of a nature that does not readily permit an accumulation of electrostatic charge that might increase the possibility of retaining particulates on surfaces on the chamber. Indeed, the chamber 300 may be fitted with electrical grounding in order to eliminate the build up of any such electrostatic charge. Also, the materials of the chamber 300 must withstand corrosive chemical cleaners at relatively high, about 60–90°, and typically about 75 to about 80° C., temperatures.

In a preferred embodiment, the chamber 300 is made of quartz, which provide several advantages: the material is able to withstand high temperatures and corrosive chemicals that are frequently used to clean the disk-shaped substrates contemplated, and it can be manufactured to a very smooth interior surface to facilitate the draining of aqueous liquids, without substantial liquid retention. Moreover, the quartz is optically transparent, permitting inspection of the contents of the cleaning chamber, even while a covering lid of the chamber is closed, as explained below.

In alternative embodiments, the cleaning chamber 300 may be fabricated from a structural polymer, such as fiber-reinforced TEFLON®, TEFLON®-coated KEVLAR®, or other synthetic substance that can be molded to produce a smooth interior surface that is hydrophobic, while at the same time providing resistance to corrosive chemicals at high temperatures. Further, the cleaning chamber 300 may also be fabricated from a corrosion resistant metal, or a metal coated with corrosion resistant and hydrophobic polymers or composites of these polymers, such as those discussed above or others with low energy surfaces.

In accordance with an aspect of the invention as shown in FIGS. 3A–3F, devices 350 producing megasonic sound waves are used on conjunction with the cleaning chamber 300, to improve cleaning of the disk-shaped substrates. In a preferred embodiment, a megasonic device 350 is mounted on a vertical side 302 of the cleaning chamber 300, and is spaced from the cleaning chamber to form a cavity with an inlet nozzle and an outlet nozzle through which a coolant liquid, such as water, flows. This coolant liquid prevents excessive heat build up by removing heat, and provides a medium through which the megasonic waves can travel to the disk-shaped objects to be cleaned. By using such coolants, the megasonic devices can be used in conjunction with the hot liquid in the cleaning chamber that typically may be in the temperature range from about 75 to about 80° C. Moreover, vertical mount of the megasonic devices 350 provides the advantage of substantially eliminating or minimizing the "shadowing" of the disk-shaped substrates, shown in FIG. 9 as a shaded area 405, from the sonic waves (energy) by the parts (rods 402) of the furniture 400 on which the substrates rest, permitting more direct access to surfaces and thereby facilitating surface cleaning.

Figure 4A:
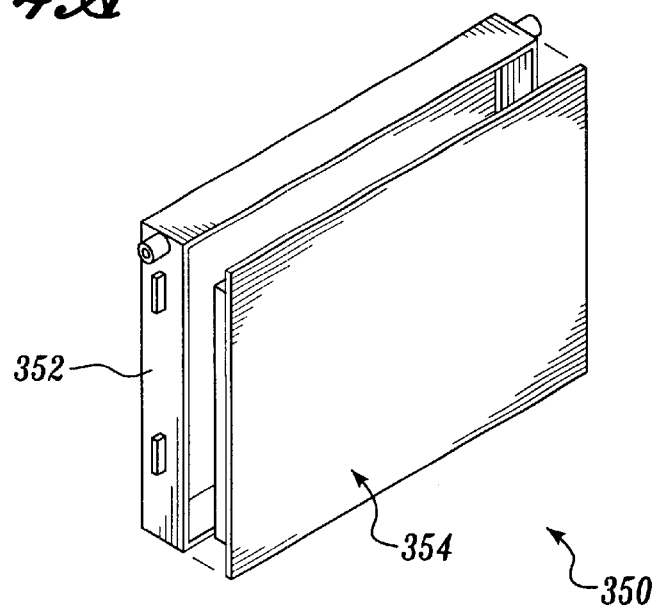
FIG. 4A is a partially exploded view the megasonic device, in schematic form, to show the interior coolant circulation space.
Figure 4B:
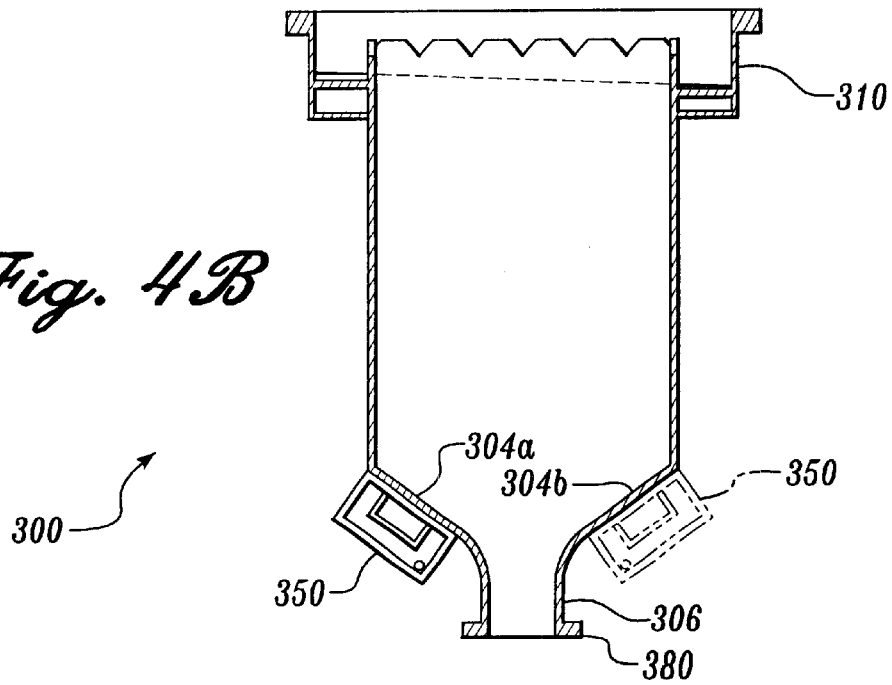
FIG. 4B is a cross sectional view of the chamber of FIG. 3F but with the magasonic device(s) mounted to the chamber base.

In an alternative embodiment, illustrated in FIG. 4B, the megasonic device is mounted on the side of downward sloping base walls 304a, 304b of the cleaning chamber. Such a base mounting may be useful under certain circumstances, but the support rods 402 of the furniture 400 will cause shadowing of certain areas of the disk-shaped substrates when such furniture is used in conjunction with base-mounted megasonic devices. Accordingly, different furniture for holding the wafers should be considered for use with base-mounted megasonic devices in order to eliminate the shadowing effect of the disk holders.

The use of the megasonic devices, especially in the preferred frequency range of about 970 kHz, in conjunction with the cleaning chemicals allows more effective cleaning, without inducing surface corrosion or surface passivation of disk substrate surfaces that include such metals as copper, aluminum and tungsten. For example, referring to FIG. 9, megasonics reduces the reduction potential of the aqueous solution, or water, to drive the potential into the "immunity zone", away from the corrosion or passivation zones. This effect may be enhanced by adding a reducing gas, for example forming gas, to the water. Forming gas comprises nitrogen and hydrogen in a ratio that includes for example, hydrogen in the range from about 4 to about 6 molar percent. This gas may be infused into the water through a membrane while oxygen might be removed through the membrane. Forming gas rates may be in the range from about 0.2 to about 2.2 cubic feet per minute, depending on the degree of adjustment required to push the system into the immunity zone.

Figure 9:
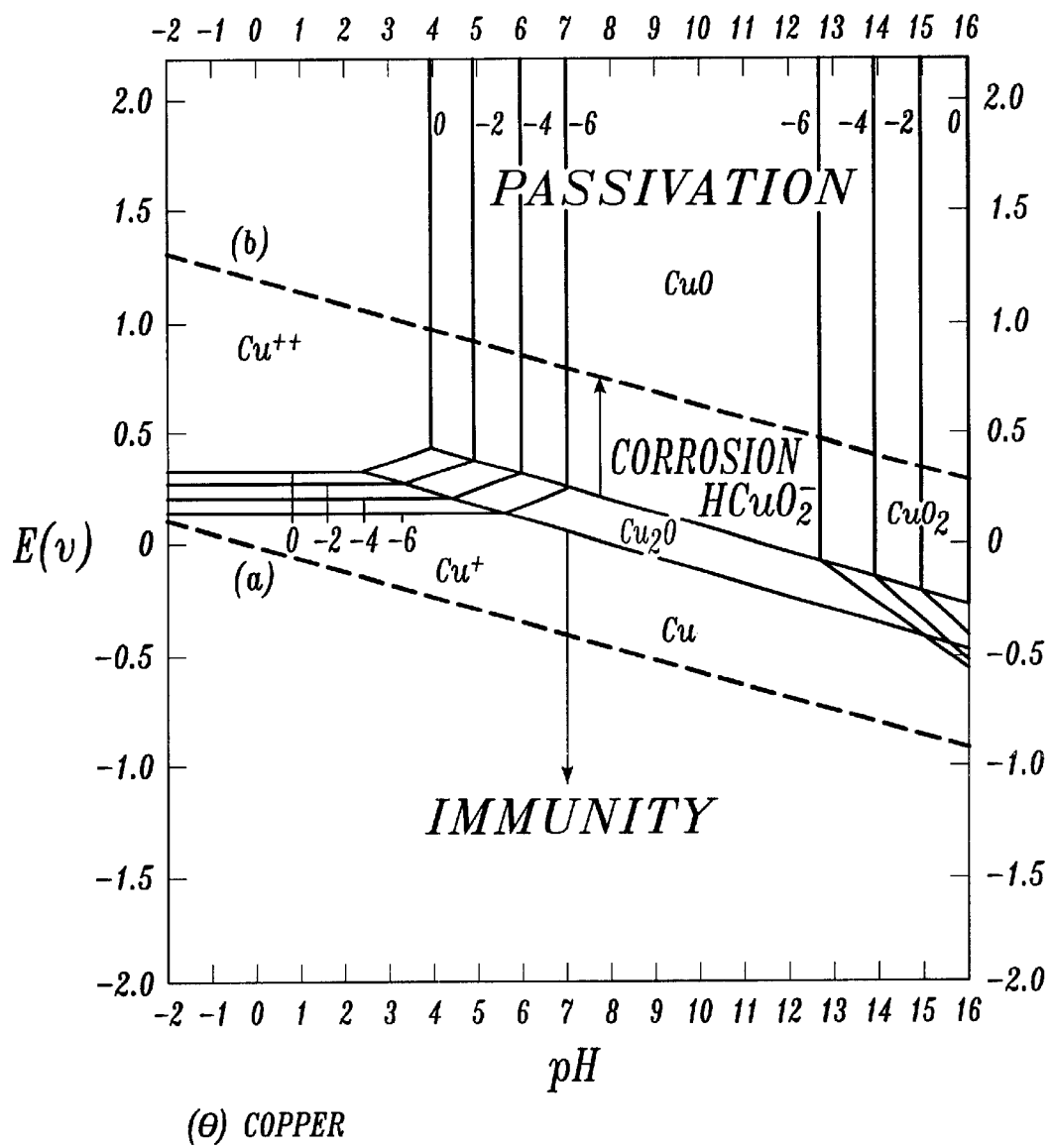
FIG. 9 is an illustrative graphical depiction of zones of corrosion, passivation, and immunity from corrosion and passivation zones in an environment defined by pH (x axis) and reduction potential (y axis).

To further facilitate cleaning in the "immunity zone" of FIG. 9, certain process parameters may be adjusted, for example: megasonic frequency, reduction potential, pH, and addition of a reducing gas.

As discussed above, the cleaning chamber 300 may be equipped with a lid, or a pair of lids. In the preferred embodiment illustrated in FIG. 2, a pair of lids 204, 206 are utilized. One of these lids is a "process lid" 204, and the other is a "drying lid" 206. The process lid 204 may be covered with a heating blanket or other device for heating it to prevent heat loss from the hot liquid in the cleaning chamber 300 and to prevent condensation on the lid underside. The lid may also be fitted with a series of gas inlets 204a, for supplying gas to the cleaning chamber 300, such as nitrogen. The drying lid 206 is likewise heated and equipped with nozzles 206a to supply a gas or vapor to the cleaning chamber 300, as needed.

When lid 204 is closed, the under surfaces of the lid contact the upper rim of the cleaning chamber 300 to form a tight seal, thereby precluding vaporization of corrosive chemicals from the cleaning chamber 300 into the environment. Likewise, during the drying process, the drying lid 206 seals the opening of the chamber.

As explained above, liquid in the cleaning chamber 300 is dumped into the plenum 260, and via one of the valves 218, 220 and 222 into a selected holding tank 224, 226, 228 through one of the bellows 252, 254 and 256, extending from each of the respective valves to the holding tanks. Thus, in the embodiment shown in FIG. 2, for instance, a first cleaning chemical solution may be dumped into tank 224, and recycled for reuse; while a second cleaning chemical may be dumped to tank 228 and recycled for reuse. Suitable rinse water depending upon the application, such as, for example, deionized water, may be dumped into holding tank 226 and routed from this tank to another holding tank for disposal. Accordingly, in accordance with the invention, cleaning chemicals that are both costly and pose hazards and costs in their disposal, may be reused thereby significantly reducing both chemical costs and chemical disposal costs.

In accordance with the invention the holding tanks may be fabricated from any suitable material that is able to withstand corrosion from the cleaning chemicals at operating conditions, for example, at temperatures in the range of about 60 to about 90° C., especially about 75 to about 80° C. Thus, the tanks may be fabricated from steel coated with TEFLON®, or another inert polymer. Alternatively, these tanks may be fabricated from a composite including a structural polymer such as KEVLAR® and coated with a material such as TEFLON®. The tanks may be equipped with internal heating coils or may be heated by a surrounding heater, for example by bonding a flexible cloth-like heater to the tank outer surface and covering the heater with a suitable insulating material to reduce heat loss to the environment.

Figure 7A:
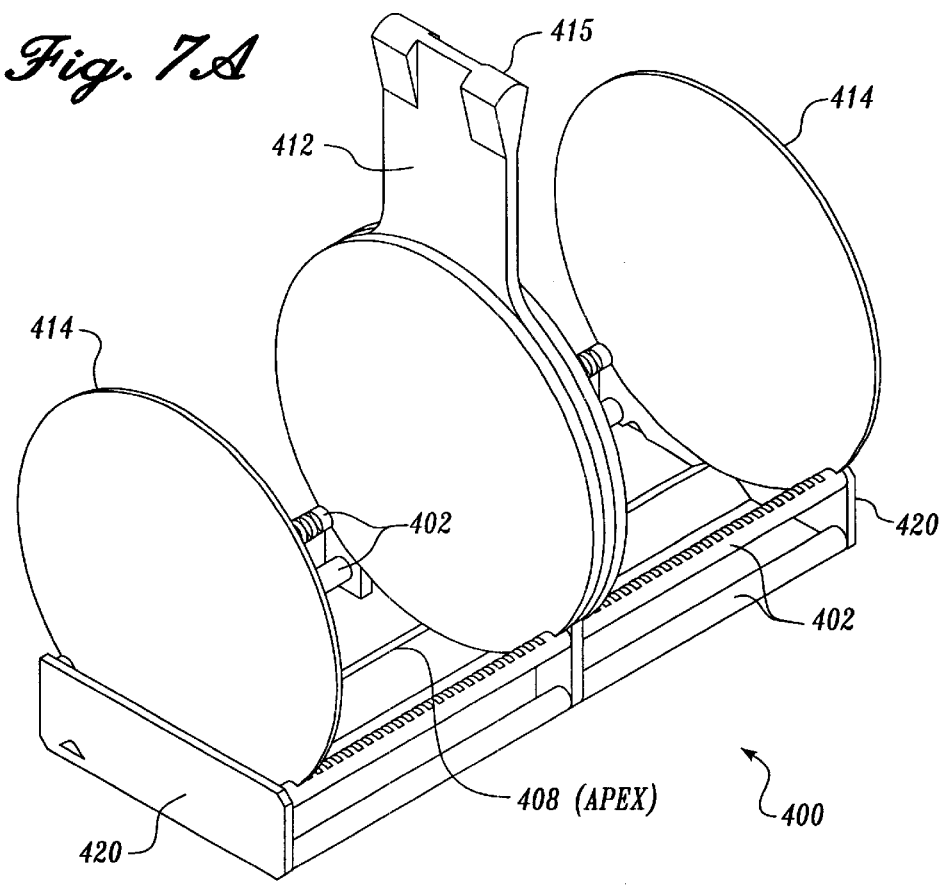
FIG. 7A is a perspective view of an embodiment of a holder for disc-shaped substrates in accordance with the invention.
Figure 7B:
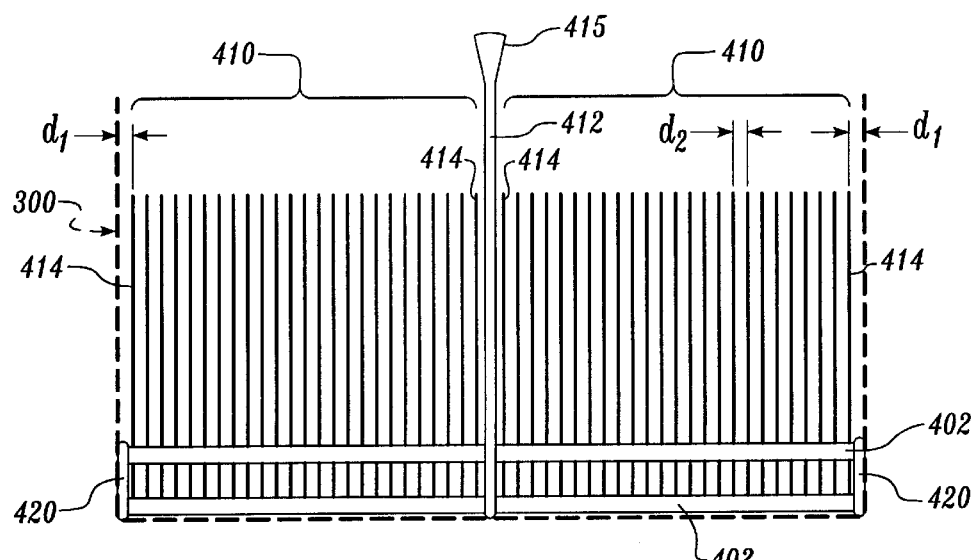
FIG. 7B is a side view of the holder for disc-shaped substrates of FIG. 8A.
Figure 7C:
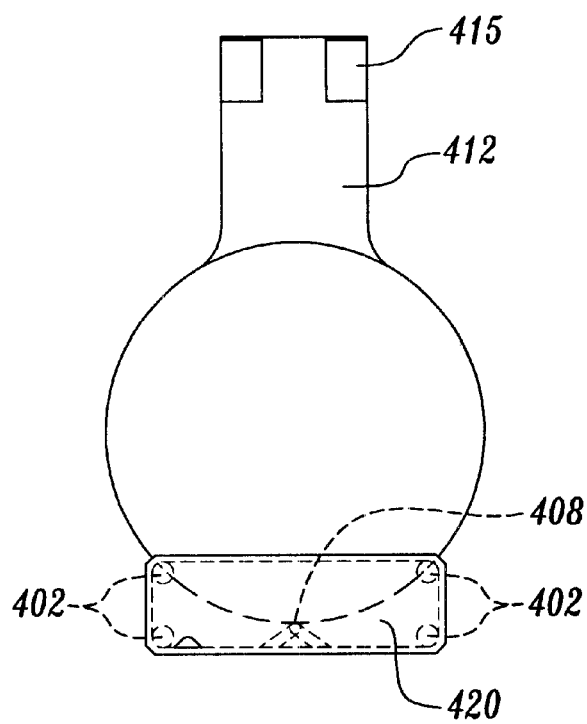
FIG. 7C is an end view of the holder of disc-shaped substrates of FIG. 8A.
Figure 8:
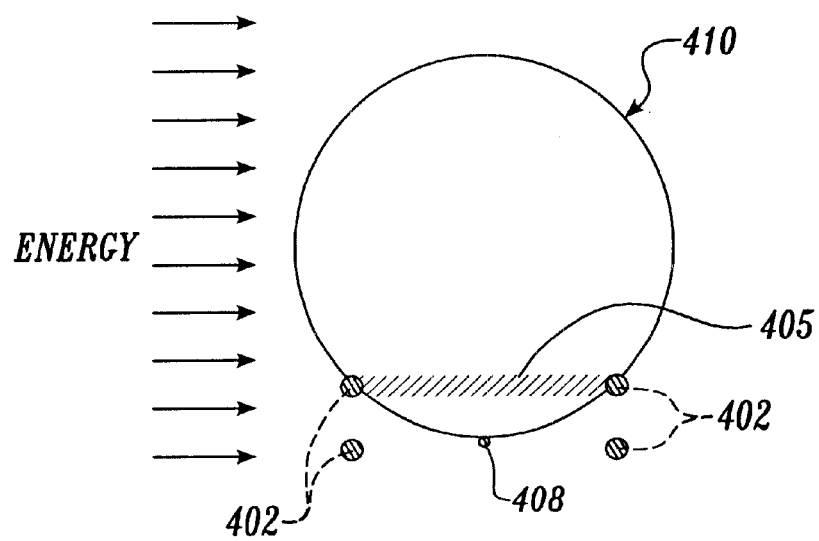
FIG. 8 is a schematic end view of a disc held in a pair of rods schematically illustrating a shadowed region behind a rod that is at least partially sheltered from incoming energy.

As shown in FIGS. 7A–C in a preferred embodiment, a plurality of wafers 410 are mounted in wafer holder 400. The nature of the wafer holder or furniture is not critical to the apparatus of the invention, but the embodiment shown has certain advantages. The furniture includes four parallel equal length horizontal rods 402, arranged in a rectangular array with opposite ends mounted to opposed end plates 420 to form a support base for disks, such as wafers 410. Each of the upper pair of rods 402 is notched at intervals with notches 404 that register with notches on each other so that a single wafer can rest in registering notches 404 of each upper rod 402 to be held vertically, as shown in FIGS. 7A and 7B. Further, the lowermost tip of the disks rests on an apex 408 formed in the base of the holder. This apex may also be notched to hold the lowermost edge of the disk to provide further holding stability. Thus, in this arrangement the wafers are supported at 3 points. This mode of holding the wafers in the wafer holder 400 is especially useful in the cleaning chamber 300 fitted with side-mounted megasonic devices 350, in that the area "shadowed" by the supporting rod and not exposed to megasonic energy directly, 402 is minimal, as shown in FIG. 8.

In a preferred embodiment, the wafer holder 400 is designed to have a central handle 412 with structure 415 that can be grasped by an end effector 452 of a robot 450 to move the holder 400 filled with wafers 410 to and from the chamber 300. Moreover, the holder 400 has two fixed end "dummy" disks 414 to minimize "end effects" that may uniquely affect disks to be cleaned that are located in these positions—they are not in the same environment as other disks that are each surrounded by other disks on both sides. Similarly, a fixed "dummy" disk 414 may be added on either side of the handle 412, for the same reason.

The cleaning chamber is preferably sized to allow about a 0.25 in. (6 mm.) clearance d1 between edges of the disks and the inner surface of the chamber, as shown in FIG. 7B, when an 8 in. (or 200 mm.) disk is being cleaned. Similarly, the space d2 in between disks on the furniture 400 is about 0.25 in. (about 6 mm.).

As indicated above, cleaning chemicals are recycled. In order to test the suitability of the chemicals for recycle, certain tests are performed preferably "on line" and in real time, to test the amount of particulates in the cleaning chemicals, and chemicals concentration parameters. For example, as shown in FIG. 2, a particle analyzer 234 is mounted downstream of filler 232, which analyzes the particulate content of the chemical from tank 224. When particulates increase to above a predetermined level, the chemical in holding tank 224 are dumped, and fresh chemicals are added. Alternatively, only a portion of the chemicals may be dumped with a make-up amount of fresh chemicals added so that the proportion of particulates is diluted and reduced to an acceptable level. Chemicals are treat similarly. For instance, if the chemical comprise hydroxyl amine, monoethanol amine, catechol amine, in an aqueous solution, then a Karl Fischer-type analysis may be carried out with an automatic sensor online, to determine amine concentration. When the chemical analysis deviates from a predetermined standard range, fresh chemicals may be added through make up, or alternatively, all or part of the chemicals may be dumped and fresh chemicals may be added in order to return the chemical solution to within the predetermined range of amine concentrations. The adjustments to achieve concentrations within the range required, may readily be achieved through an automated system using a programmed digital signal processor that receives an input based on the analysis of the chemical solution, and which calculates the adjustments necessary, if any, to achieve concentrations within predetermined parameters. The digital signal processor then controls control valves that control the dumping chemicals from the holding tank, and adding chemicals to the holding tank in required quantities, until the chemical analysis is within the specified range.

Figure 6:
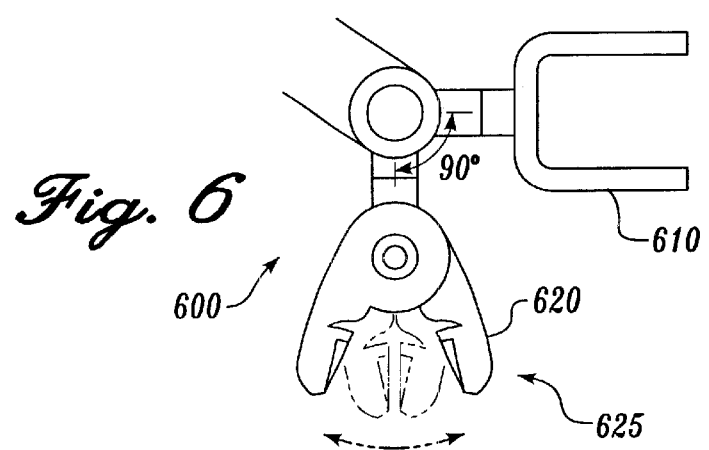
FIG. 6 is a view of the end effector of a six axis robot useful in the present invention.

As discussed above, in a preferred embodiment the wafers to be cleaned are handled entirely by robotic means to facilitate cleaning and to expedite the process. The preferred robot is a six axis robot available from Staubli of Switzerland, model #RX90BHPCR. In accordance with the invention, however, the end-effector of the robot may be modified as schematically illustrated in FIG. 6. Robot arm 600 has an end equipped with end effectors 610 and 620, arranged at 90 degrees from each other. By selectively swiveling the end of the arm 600, either end-effector 610 or end-effector 620 maybe used.

The dual end-effector robot arm is especially useful in the invention since it eliminates the need to remove the end-effector and replace with another, to enable the robot to perform two separate and distinct functions. This reduces the amount of contaminants in the process field, and also expedites robotic action by eliminating the time required to change end-effectors.

In accordance with the preferred embodiment of the invention, a cassette of wafers (25 wafers) is placed on a support, and the first end-effector 610 is robotically moved to a position under the cassette to lift the cassette from the support. The properly spaced wafers on the cassette are then transported on end-effector 610 to furniture 400 that includes 50 positions for holding wafers, 25 on each side of the central handle 415. The wafers are robotically deposited on one side of the handle, thereby filling one-half of the furniture 400. Similarly, a second cassette of wafers is transported by end-effector 610 to fill the other half of the furniture 400.

Once the furniture 400 is suitably filled with wafers, the robotic arm 600 is activated to swivel and rotate end-effector 620 into position. Preferably, end-effector 620 has a grasping end 625 that is adapted for grasping furniture handle 415. The end-effector 620 grasps the handle 415 and transports the wafer-filled furniture 400 to the cleaning chamber 300, accurately depositing the furniture in the cleaning chamber 300 so that cleaning can commence. Once the cleaning process is completed, the above explained procedure is reversed. End-effector 602 is used to remove the wafer-filled furniture 400 from the cleaning chamber 300, and place the furniture 400 on a support base. Next, end-effectors are exchanged by swivelling or rotating end effector 610 into active position, so that wafers can be removed from the furniture and placed into wafer cassettes on another support, for further processing of the wafers.

The foregoing description provides an enabling disclosure of the invention, which is not limited by the description but only by the scope of the appended claims. All those other aspects of the invention that will become apparent to a person of skill in the art, who has read the foregoing, are within the scope of the invention and of the claims herebelow.

What is claimed is:

1. An apparatus for cleaning semiconductor wafers and reusing a chemical cleaning solution, the apparatus comprising:
   (a) a chamber sized for receiving a plurality of wafers to be cleaned;
   (b) an outlet in the base of the chamber for draining liquids from the chamber;
   (c) a plenum located below the chamber, the plenum in fluid communication with the chamber via the chamber outlet, the plenum comprising at least two outlets in a base thereof;
   (d) at least two holding tanks, each of the tanks in fluid communication with one of the at least two outlets of the plenum to receive liquids drained through the respective outlet when the apparatus is in use;
   (e) a recycle system for at least one of the holding tanks, the recycle system comprising:
      (i) an analyzer for chemical analysis of liquid recycled in the at least one holding tank when the apparatus is in use;
      (ii) a particle detector for detection of particles in liquids recycled in the at least one holding tank when the apparatus is in use; and
      (iii) a pump with an inlet port in fluid communication with the at least one of the holding tanks for recycling of liquid;
   wherein each of the at least 2 outlets in the base of the plenum is equipped with a fast-acting valve, each valve in communication with a conduit for draining liquid from the plenum to one of the at least two holding tanks; and
   wherein at least one of the valves has a domed upper surface, the dome extending above the level of the base of the plenum and the peripheral edges of the dome not sunken below the level of the surrounding plenum base.

2. The apparatus of claim 1, wherein the chamber comprises quartz, interior surfaces of the chamber being smooth and substantially free of traps for liquids or particulates.

3. The apparatus of claim 2, wherein the quartz chamber comprises side walls having thicknesses of about 3 mm.

4. The apparatus of claim 1, further comprising a megasonic generator mounted to a side of the chamber.

5. The apparatus of claim 1, further comprising a megasonic generator mounted to a base portion of the chamber.

6. The apparatus of claim 1, wherein the outlet in the base of the chamber extends substantially along an entire length of the chamber.

7. The apparatus of claim 1, wherein the plenum has a sufficient vertical height to prevent the migration of particulates from cleaned wafers from the base of the plenum back into the chamber.

8. The apparatus of claim 1, wherein one of the at least two holding tanks comprises a surrounding heater and the surrounding heater is enclosed with an insulating material.

9. The apparatus of claim 1, wherein materials of construction having surfaces exposed to chemical cleaning solutions when the apparatus is in use comprises a material substantially resistant to corrosion by the cleaning solution at temperatures from the range from about 60 to about 90° C.

10. The apparatus of claim 1, wherein the recycle system further comprises a control system, the control system comprising a programmable processor, the processor receiving inputs from the analyzer and the particle detector, and controlling a proportion of liquid from the holding tanks to be recycled, based on the inputs from the analyzer and the particle detector.

11. The method of claim 10, wherein the processor controls control valves for supplying make-up chemical solution to the at least one of the holding tanks, and for removing liquid from said holding tank based on inputs from the analyzer and the particle detector.

* * * * *